US009578776B2

(12) United States Patent
Hsiao (10) Patent No.: US 9,578,776 B2
(45) Date of Patent: Feb. 21, 2017

(54) SECURE DEVICE (71) Applicants: Inventec (Pudong) Technology Corporation, Shanghai (CN); INVENTEC CORPORATION, Taipei (TW)

(72) Inventor: Chia-Liang Hsiao, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 163 days.

(21) Appl. No.: 14/674,615

(22) Filed: Mar. 31, 2015

(65) Prior Publication Data
US 2016/0135309 A1 May 12, 2016

(30) Foreign Application Priority Data
Nov. 12, 2014 (CN) .......................... 2014 1 0634563

(51) Int. Cl.
*G01R 31/20* (2006.01)
*H05K 7/14* (2006.01)
(52) U.S. Cl.
CPC ..... *H05K 7/142* (2013.01); *H05K 2201/09145* (2013.01)
(58) Field of Classification Search
CPC . G01R 1/0483; G01R 1/7378; G01R 1/07314; G01R 1/07342; G01R 31/2886; G01R 31/2887; H05K 5/0221; H05K 7/142; H05K 7/183; H05K 7/1487; H05K 7/1489; H05K 7/1492
See application file for complete search history.

(56) References Cited

U.S. PATENT DOCUMENTS

| 6,617,867 | B2 * | 9/2003 | Bruno | ................ | G01R 1/07378 324/750.25 |
| 2008/0089020 | A1 * | 4/2008 | Hiew | ................... | H05K 9/0067 361/679.31 |

* cited by examiner

*Primary Examiner* — Minh N Tang
(74) *Attorney, Agent, or Firm* — Muncy, Geissler, Olds & Lowe, P.C.

(57) ABSTRACT

A secure device is used for securing a printed circuit board assembly. The secure device includes a fixed base and a plurality of removable securing member. The fixed base includes a base body, a plurality of locking structures and fixed structures. The fixed structure has a key-shape hole. Each of the removable securing members respectively includes a post, an interference portion and a lock portion. When the printed circuit board assembly is operated to be secured by the removable securing members, a first side of the printed circuit board assembly needs to be locked by the locking structure firstly; the interference portion of each removable securing member needs to be inserted into the key-shape hole, and interfered with the key-shape hole after the respective of the removable securing members is turned along a rotation direction, thereby to make the printed circuit board assembly secured by the removable securing members.

5 Claims, 7 Drawing Sheets

SECURE DEVICE

FIELD OF THE INVENTION

The present invention is related to a secure device for a printed circuit board assembly, and more particularly related to a secure device for securing a printed circuit board assembly by using the removable securing members.

BACKGROUND OF THE INVENTION

In the field of modern electronic engineering, it is common to fix and assemble the printed circuit board assembly by the way of screw-fixing in the process of assembling the printed circuit board assembly (PCA). The mechanism of screw fixing can fix the printed circuit board assembly effectively, however, in the assembling and disassembling processes, the user needs to use the assistant of accessory tools such as screw drivers and the processes are time consuming. In addition, there needs some additional through holes formed on the printed circuit board as the printed circuit board assembly is manufactured, which may cause a waste of the layout space on the printed circuit board.

In order to overcome the problem of screw-fixing, the conventional art adopts the locking members disposed on the base or the frame to fix the printed circuit board assembly. Such assembling method does not need to use the accessory tools, however, the electronic parts on the printed circuit board assembly might have a higher probability to be damaged. In addition, because the locking members are formed on the base or the frame, the installable printed circuit board assemblies are restricted thereby such that the printed circuit board assembly of different size might not be installable. In addition, if some area on the printed circuit board assembly is reserved for the locking members to make sure that the printed circuit board assembly is installable, the layout area on the printed circuit board might be correspondingly reduced.

BRIEF SUMMARY OF INVENTION

In view of the conventional art, the method of assembling the printed circuit board assembly by screw-fixing has the drawbacks such as the need to use the accessory tools, more assembling/dissembling time consumption, and the through holes formed on the printed circuit board might restrict the internal layout area on the printed circuit board, etc., and the method of assembling the printed circuit board assembly by using the locking members has the drawbacks such as the electronic parts on the printed circuit board assembly have higher probability to be damaged, and the limitation to exchange the printed circuit board assemblies with different size.

Accordingly, it is a main object to the present invention to provide a secure device for a printed circuit board assembly, which adopts the removable securing member to secure the printed circuit board assembly such that the through holes on the printed circuit board can be skipped.

As mentioned, a secure device for securing a printed circuit board assembly is provided in accordance with the present invention. The secure device is utilized for securing a printed circuit board assembly having a circuit board main body with a first side and a second side opposite to the first side. The secure device includes a fixed base and a plurality of removable securing members.

The fixed base includes a base body, a plurality of locking structures, and a plurality of fixed structures. The plurality of locking structures is symmetrically disposed on both sides of the base body for locking the first side. The plurality of fixed structures is symmetrically disposed on the both sides of the base body. The fixed structures and the locking structures are alternatively disposed on the base body, and each of the fixed structure has a key-shaped hole. The plurality of removable securing members is utilized for fixing the second side. Each of the removable securing members includes a post, an interference portion, and a lock portion. The interference portion is disposed on one end of the post and corresponding to the key-shaped hole. The lock portion is disposed on another end of the post opposite to the end with the interference portion and is utilized for locking the second side.

Wherein, as the first side of the circuit board main body is locked to the locking structure, the interference portion of the removable securing member is correspondingly inserted into the key-shaped hole of the fixed structure and interfered with the key-shaped hole by turning the removable securing members along a rotation direction, and the lock portion of the removable securing member is locked to the second side of the circuit board main body to fix the printed circuit board assembly on the fixed base.

In accordance with a preferred embodiment of the present invention, the fixed structure further comprises a first stopper and a second stopper, symmetrically disposed on corners of the key-shaped hole for restricting range of rotation of the lock portion.

In accordance with a preferred embodiment of the present invention, the removable securing member further comprises a supporting portion, disposed on one side of the post opposite to the lock portion, for engaging with the fixed structures. In addition, as a preferred embodiment, the fixed structure further comprises a positioning protrusion for engaging with the supporting portion.

In accordance with a preferred embodiment of the present invention, the second side of the circuit board main body has two corner notches corresponding to two of the fixed structures which are oppositely disposed on the base body.

The embodiments adopted in the present invention would be further discussed by using the flowing paragraph and the figures for a better understanding.

DETAILED DESCRIPTION OF THE INVENTION

Figure 1:
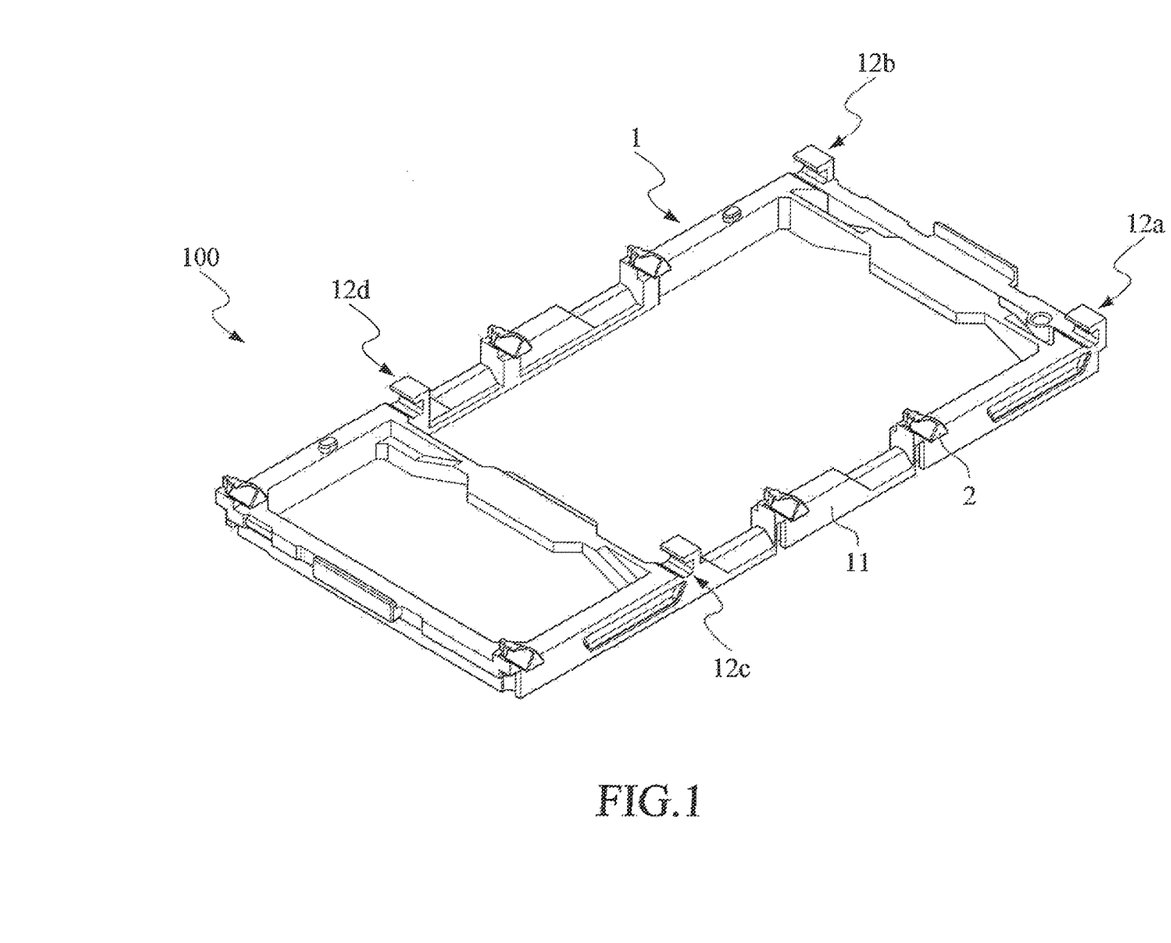
FIG. 1 is a 3D schematic view showing the secure device for a printed circuit board assembly in accordance with a preferred embodiment of the present invention.
Figure 2:
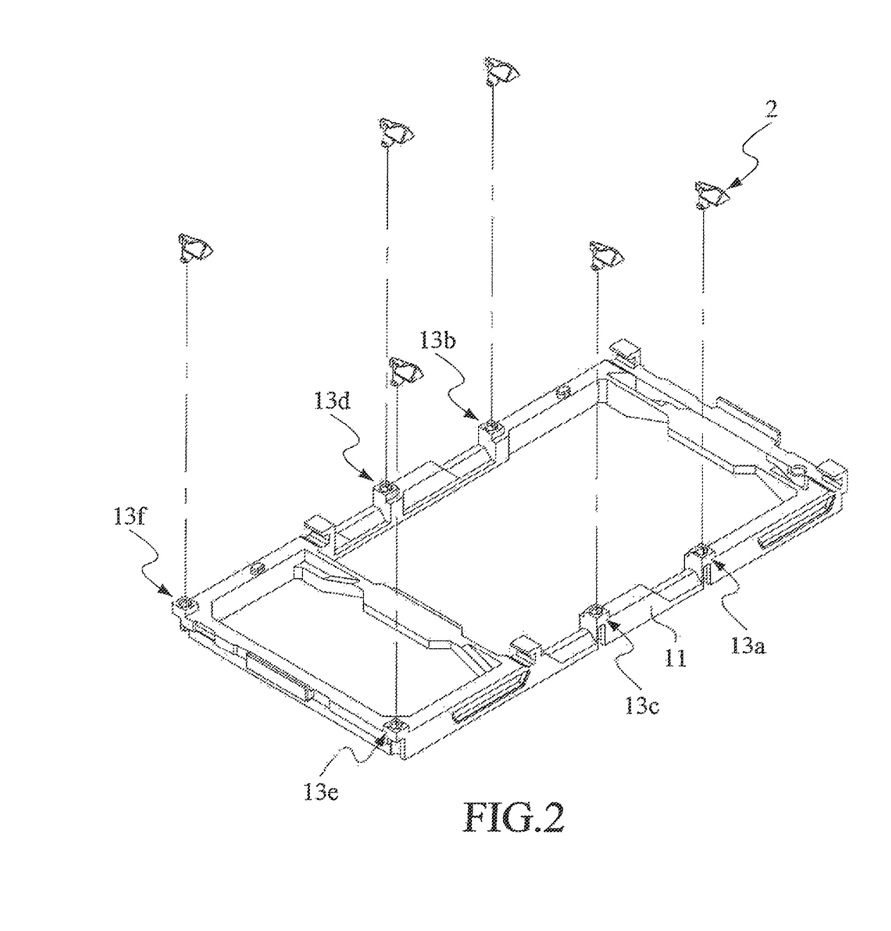
FIG. 2 is an explosive view showing the secure device for a printed circuit board assembly in accordance with a preferred embodiment of the present invention.
Figure 3:
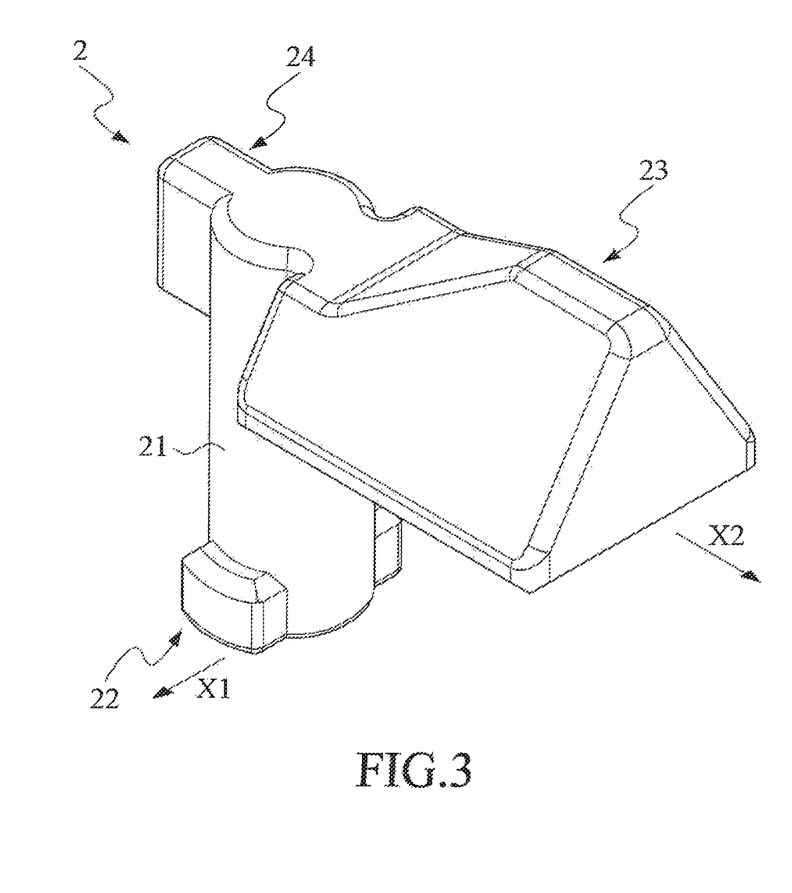
FIG. 3 is a 3D schematic view showing the removable securing member in accordance with a preferred embodiment of the present invention.
Figure 4:
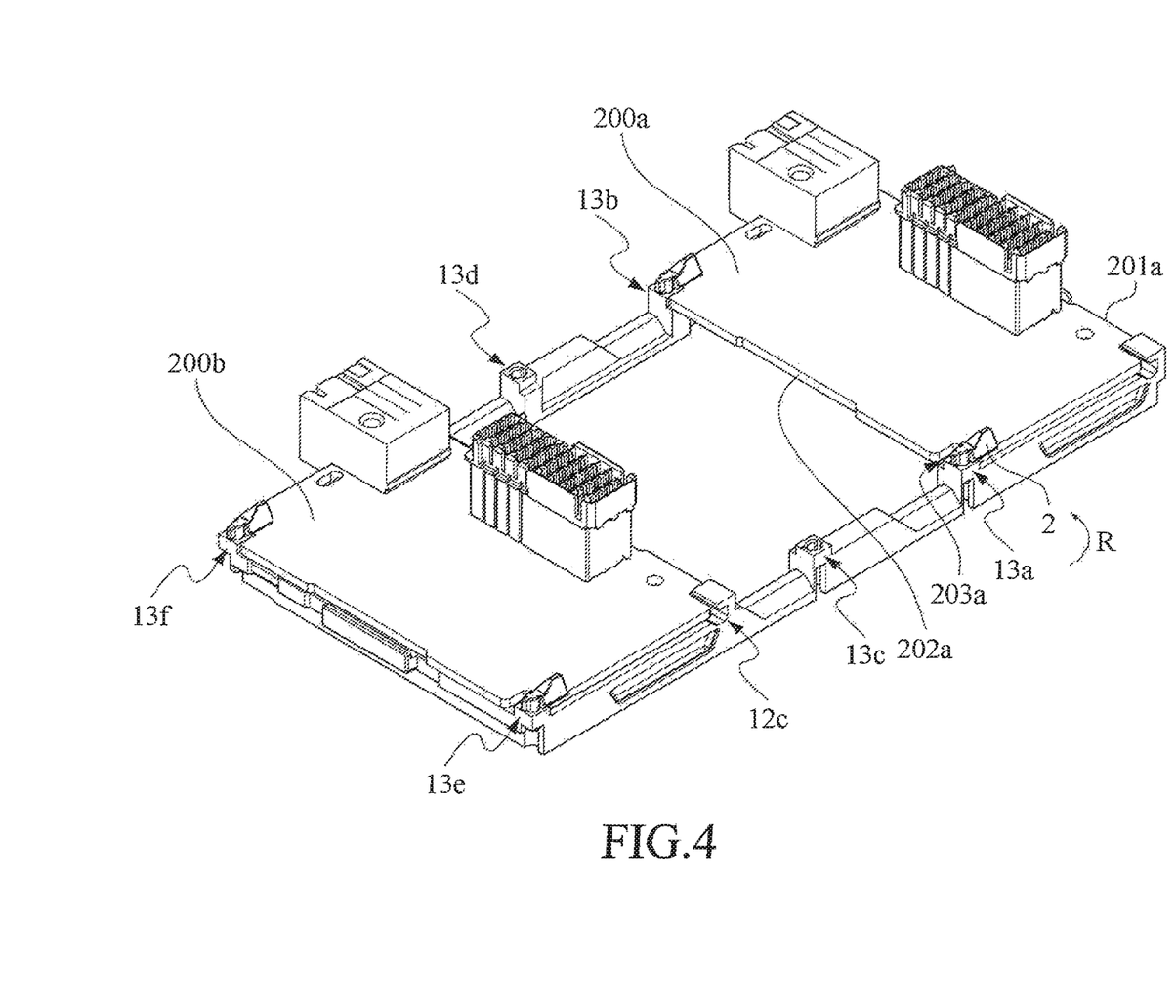
FIG. 4 is a 3D schematic view showing the printed circuit board assembly assembled to the secure device in accordance with a preferred embodiment of the present invention.
Figure 5:
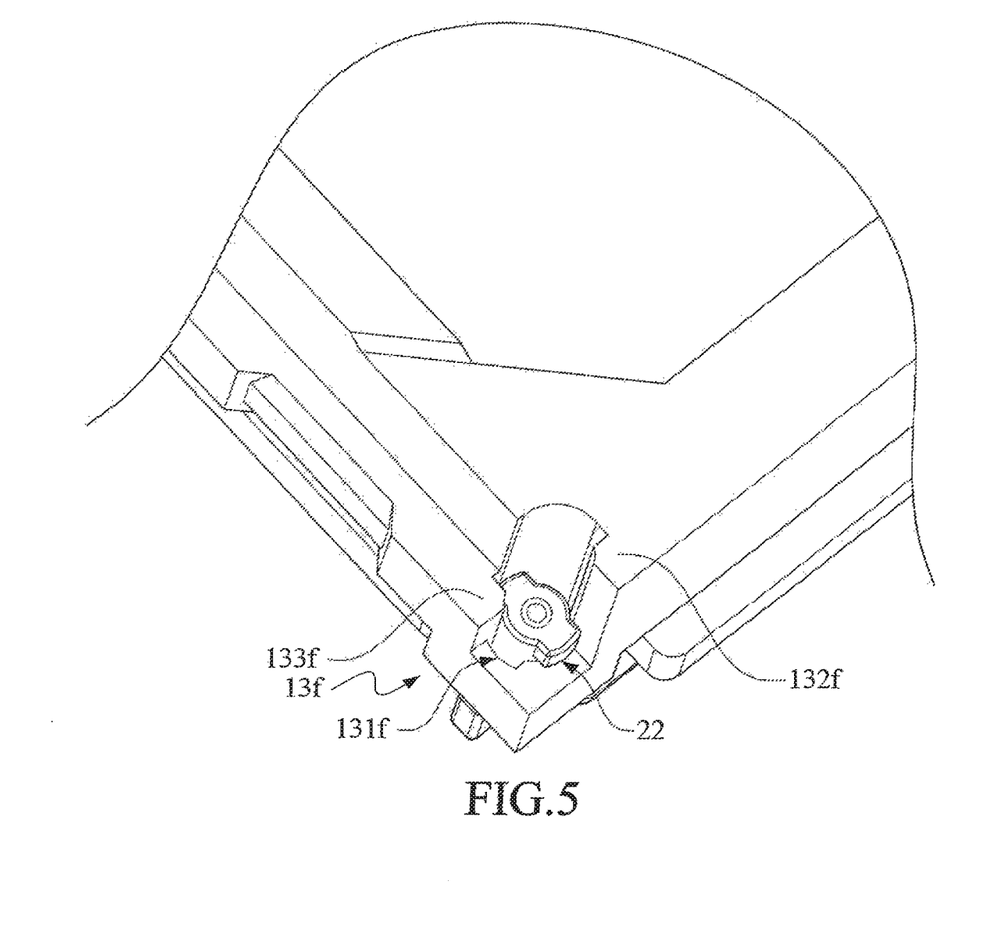
FIG. 5 is a 3D enlarged view showing the backside of the secure device for a printed circuit board assembly in accordance a preferred embodiment of the present invention.
Figure 6:
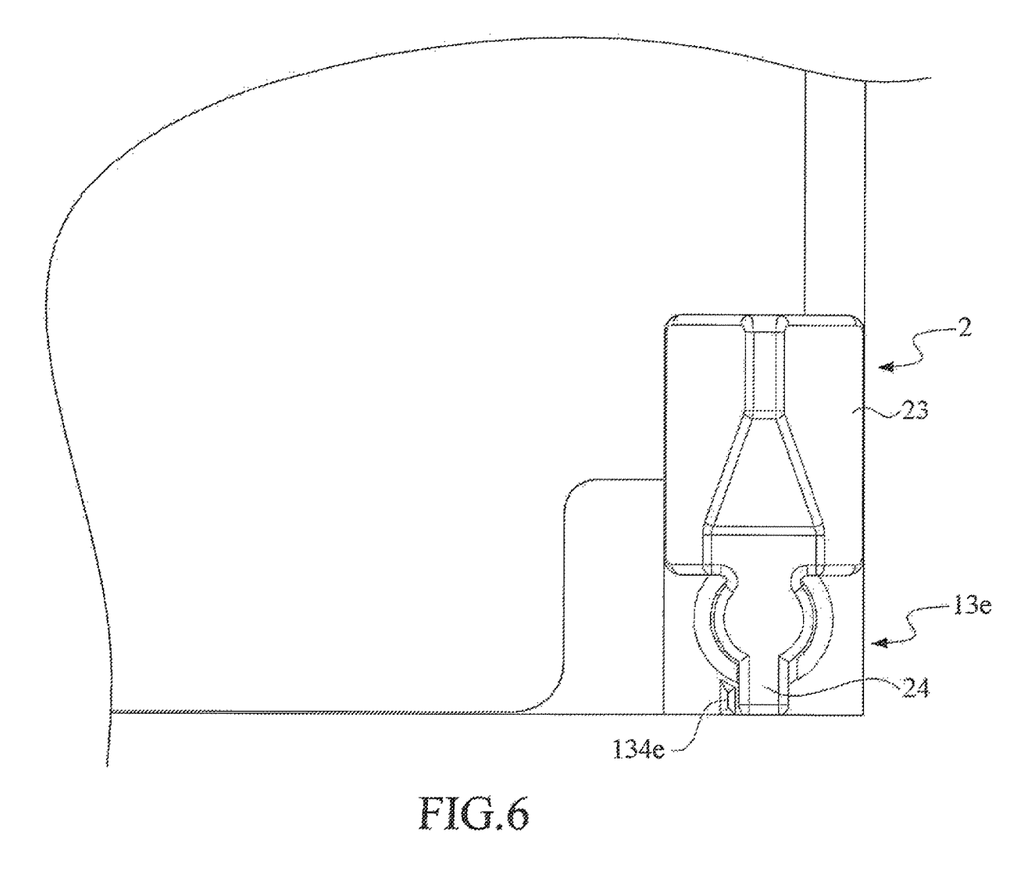
FIG. 6 is a planar enlarged view showing the front side of the secure device for a printed circuit board assembly in accordance with a preferred embodiment of the present invention.

Please refer to FIG. 1 to FIG. 6, wherein FIG. 1 is a 3D schematic view showing the secure device for a printed circuit board assembly in accordance with a preferred embodiment of the present invention; FIG. 2 is an explosive view showing the secure device for a printed circuit board assembly in accordance with a preferred embodiment of the present invention; FIG. 3 is a 3D schematic view showing the removable securing member in accordance with a preferred embodiment of the present invention; FIG. 4 is a 3D schematic view showing the printed circuit board assembly assembled to the secure device in accordance with a preferred embodiment of the present invention; FIG. 5 is a 3D enlarged view showing the backside of the secure device for a printed circuit board assembly in accordance a preferred embodiment of the present invention; and FIG. 6 is a planar enlarged view showing the front side of the secure device for a printed circuit board assembly in accordance with a preferred embodiment of the present invention.

As shown, the secure device 100 for a printed circuit board assembly comprises a fixed base 1 and six removable securing members 2 (only one of them is labeled).

The fixed base 1 includes a base body 11, four locking structures 12a, 12b, 12c, 12d, and six fixed structures 13a, 13b, 13c, 13d, 13e, 13f.

The four locking structures 12a, 12b, 12c, 12d are symmetrically disposed on the both sides of the base body 11. The six fixed structures 13a, 13b, 13c, 13d, 13e, 13f are symmetrically disposed on the both sides of the base body 11. In addition, the locking structures 12a, 12b, 12c, 12d and the fixed structures 13a, 13b, 13c, 13d, 13e, 13f are alternative disposed on the base body 11. In the present embodiment, the locking structures 12a, 12c and the fixed structures 13a, 13c are disposed on the same side, and the fixed structures 13a, 13c are located between the locking structures 12a and 12c; and correspondingly, the locking structures 12b, 12d and the fixed structures 13b, 13d are disposed on the same side, and the fixed structures 13b, 13d are located between the locking structures 12b and 12d.

Take the fixed structure 13f for example. The fixed structure 13f includes a key-shaped hole 131f, a first stopper 132f, and a second stopper 133f. The first stopper 132f and the second stopper 133f are symmetrically disposed on the opposite corners of the key-shaped hole 131f.

Each of the six removable securing members 2 includes a post 21, an interference portion 22, a lock portion 23, and a supporting portion 24. The interference portion 22 is disposed on one end of the post 21 and corresponding to the key-shaped hole 131f. The interference portion 22 includes two protrusion (not labeled in the figures) extended away from the end portion of the post 21 along a first axis X1 to compose a non-circular structure corresponding to the key-shaped hole 131f. Thus, the interference portion 22 is capable to penetrate the key-shaped hole 131f and interfere with the key-shaped hole 131f after rotating.

The lock portion 23 is disposed on another end of the post 21 opposite to the interference portion 22. The supporting portion 24 is disposed on the side of the post 21 opposite to the lock portion 23 for engaging with the fixed structure 13f.

Wherein, the lock portion 23 and the supporting portion 24 are extended along a second axis X2, which is perpendicular to the first axis X1.

Moreover, take the fixed structure 13e for example, the fixed structure 13e further includes a positioning protrusion 134e for engaging with the supporting portion 24.

In practical application, the secure device 100 is utilized for fixing two printed circuit board assemblies 200a, 200b. The printed circuit board assembly 200a has a circuit board main body (not labeled in the figures), which has a first side 201a and a second side 202a opposite to the first side 201a, and the second side 202a has two corner notches 203a formed thereon (only one of them is labeled). The two corner notches 203a are corresponding to the fixed structures 13a, 13b. As the user wants to assemble the printed circuit board assembly 200a to the base body 11, he may lock the first side 201a of the circuit board main body to the locking structures 12a, 12b first, and then insert the interference portions 22 of the two removable securing members 2 into the corresponding key-shaped holes (not labeled in the figures) of the fixed structures 13a, 13b and turn the removable securing members 2 along a rotation direction R to have the interference portions 22 of the two removable securing members 2 interfered with the fixed structures 13a, 13b, respectively. Then, the lock portions 23 of the two removable securing members 2 are locked to the second side 202a to have the printed circuit board assembly 200a fixed on the fixed base 1.

It should be noted that because the extending directions of the lock portion 23, the supporting portion 24, and the interference portion 22 are perpendicular to each other, the stability of the securing mechanism between the removable securing members 2 and the printed circuit board assemblies 200a, 200b can be effectively enhanced. In accordance with the other embodiments, the lock portion 23, the supporting portion 24, and the interference portion 22 might be extended along the same direction if it is necessary. However, such arrangement might have the issue of stress concentration.

Similarly, the printed circuit board assembly 200b has the lock structures 12c, 12d utilized for locking the first side (not labeled in the figures) and two removable securing members 2 to be inserted into the fixed structures 13e, 13f, respectively and turned along the rotation direction R so as to have the lock portions 23 thereof lock the second side of the printed circuit board assembly 200b. Wherein, the first stopper 132f and the second stopper 133f are used to restrict the rotation range of the lock portion 23 as the removable securing member 2 is turned along the rotation direction R.

In addition, take the embodiment shown in FIG. 6 as an example, when the lock portion 23 is turned to the upper side of the printed circuit board assembly 200b, the supporting portion 24 may also rotate along the rotation direction R and slide over the positioning protrusion 134e so as to engage with the positioning protrusion 134e.

Figure 7:
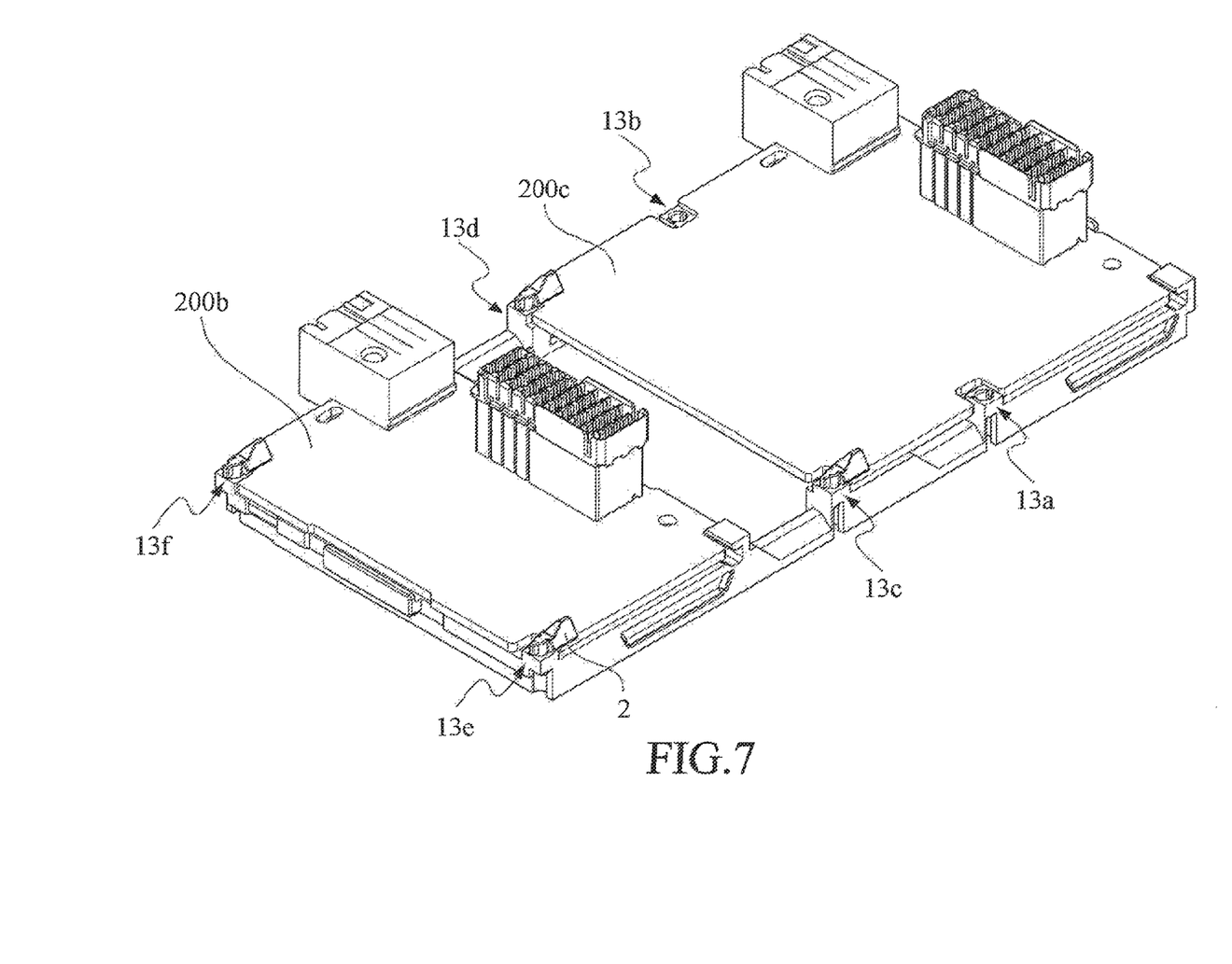
FIG. 7 is a 3D schematic view showing another printed circuit board assembly assembled to the secure device in accordance with a preferred embodiment of the present invention.

Please further refer to FIG. 7, which is a 3D schematic view showing another printed circuit board assembly assembled to the secure device in accordance with a preferred embodiment of the present invention. As shown, as the user wants to change the printed circuit board assembly 200a by the printed circuit board assembly 200c, he only needs to turn the removable securing members 2 originally assembled to the fixed structures 13a, 13b along a rotation direction opposite to the rotation direction R to release the interference portion 22 of the removable securing members 2 such that the removable securing members 2 and the printed circuit board assembly 200a can be removed. Then, the printed circuit board assembly 200c can be assembled by using the above mentioned assembling method. The only difference is that, because the printed circuit board assembly 200c is bigger than the printed circuit board assembly 200a, the removable securing member 2 should be assembled to the fixed structures 13c, 13d to fix the printed circuit board assembly 200c by the same way.

In conclusion, in compared with the conventional art of securing the printed circuit board assembly by the ways of screw-fixing and locking, because the secure device for the printed circuit board assembly provided in accordance with the present invention has the feature of adopting the engagement of the fixed structure and the removable securing member to fix the printed circuit board assembly, the assistant of accessory tools can be skipped and the position in which the removable securing members are assembled to the fixed structure can be adjusted according to the size of the printed circuit board assembly such that the operational convenience can be enhanced.

The detail description of the aforementioned preferred embodiments is for clarifying the feature and the spirit of the present invention. The present invention should not be limited by any of the exemplary embodiments described herein, but should be defined only in accordance with the following claims and their equivalents. Specifically, those skilled in the art should appreciate that they can readily use the disclosed conception and specific embodiments as a basis for designing or modifying other structures for carrying out the same purposes of the present invention without departing from the scope of the invention as defined by the appended claims.

I claim:

1. A secure device, utilized for securing a printed circuit board assembly having a circuit board main body with a first side and a second side opposite to the first side, and the secure device comprising:
    a fixed base, including:
        a base body;
        a plurality of locking structures, symmetrically disposed on both sides of the base body for locking the first side; and
        a plurality of fixed structures, symmetrically disposed on the both sides of the base body, the fixed structures and the locking structures being alternatively disposed on the base body, and each of the fixed structure having a key-shaped hole; and
    a plurality of removable securing members, for fixing the second side, and each of the removable securing members including:
        a post;
        an interference portion, disposed on one end of the post and corresponding to the key-shaped hole; and
        a lock portion, disposed on another end of the post opposite to the end with the interference portion, for locking the second side;
    wherein, as the first side of the circuit board main body is locked to the locking structure, the interference portion of the removable securing member is correspondingly inserted into the key-shaped hole of the fixed structure and interfered with the key-shaped hole by turning the removable securing members along a rotation direction, and the lock portion of the removable securing member is locked to the second side of the circuit board main body to fix the printed circuit board assembly on the fixed base.

2. The secure device of claim 1, wherein the fixed structure further comprises a first stopper and a second stopper, symmetrically disposed on corners of the key-shaped hole for restricting a range of rotation of the lock portion.

3. The secure device of claim 1, wherein the removable securing member further comprises a supporting portion, disposed on one side of the post opposite to the lock portion, for engaging with the fixed structures.

4. The secure device of claim 3, wherein the fixed structure further comprises a positioning protrusion, for engaging with the supporting portion.

5. The secure device of claim 1, wherein the second side of the circuit board main body has two corner notches corresponding to two of the fixed structures which are oppositely disposed on the base body.

* * * * *